US008927301B2

(12) United States Patent
Gaidis et al.

(10) Patent No.: US 8,927,301 B2
(45) Date of Patent: Jan. 6, 2015

(54) SPIN-TORQUE BASED MEMORY DEVICE WITH READ AND WRITE CURRENT PATHS MODULATED WITH A NON-LINEAR SHUNT RESISTOR

(75) Inventors: Michael C. Gaidis, Yorktown Heights, NY (US); Janusz J. Nowak, Hopewell Junction, NY (US); Jonathan Z. Sun, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 350 days.

(21) Appl. No.: 13/552,033

(22) Filed: Jul. 18, 2012

(65) Prior Publication Data

US 2012/0288964 A1 Nov. 15, 2012

Related U.S. Application Data

(62) Division of application No. 12/701,867, filed on Feb. 8, 2010, now Pat. No. 8,270,208.

(51) Int. Cl.
| | |
|---|---|
| H01L 21/00 | (2006.01) |
| H01L 27/22 | (2006.01) |
| G11C 11/16 | (2006.01) |
| H01L 27/24 | (2006.01) |
| H01L 43/08 | (2006.01) |
| H01L 45/00 | (2006.01) |

(52) U.S. Cl.
CPC .............. *H01L 27/224* (2013.01); *G11C 11/16* (2013.01); *H01L 27/24* (2013.01); *H01L 43/08* (2013.01); *H01L 45/04* (2013.01); *H01L 45/145* (2013.01)
USPC ............................................... 438/3; 257/421

(58) Field of Classification Search
USPC ...................... 365/158, 171; 438/3; 257/421, 257/E29.323, E21.665
See application file for complete search history.

(56) References Cited

U.S. PATENT DOCUMENTS

| | | | |
|---|---|---|---|
| 3,493,940 | A | 2/1970 | Shafer |
| 3,534,340 | A | 10/1970 | Murray et al. |
| 3,670,312 | A | 6/1972 | Broadbent |
| 6,985,385 | B2 | 1/2006 | Nguyen et al. |
| 6,990,013 | B2 * | 1/2006 | Sato et al. ..................... 365/158 |
| 7,009,877 | B1 | 3/2006 | Huai et al. |
| 7,110,284 | B2 | 9/2006 | Hayakawa et al. |

(Continued)

OTHER PUBLICATIONS

Numata, H. et al., "Scalable Cell Technology Utilizing Domain Wall Motion for High-speed MRAM," 2007 Symposium on VLSI Technology Digest of Technical Papers, pp. 232-233.

*Primary Examiner* — Vu Le
(74) *Attorney, Agent, or Firm* — Cantor Colburn LLP; Vazken Alexanian

(57) ABSTRACT

A fabrication method includes forming a spin-polarizing layer, a spin transport layer on the spin polarizing layer on a substrate, a free layer magnet on the spin transport layer, a non-magnetic layer on the spin polarizing layer, a reference layer on the non-magnetic layer, and a hard mask layer on the reference layer, etching the hard mask layer and forming a read portion including the reference layer, the nonmagnetic layer and the free layer magnet, forming a nonlinear resistor layer on surfaces of the spin transport layer, the spacers, and the hard mask layer, etching the nonlinear resistor layer, the spin transport layer, and the spin polarizing layer and forming a write portion including the spin transport layer and the spin polarizing layer, forming an interlevel dielectric layer, forming a trench, exposing an upper surface of the reference layer of the read and write portions.

20 Claims, 6 Drawing Sheets

(56) References Cited

U.S. PATENT DOCUMENTS

| | | |
|---|---|---|
| 7,190,611 B2 | 3/2007 | Nguyen et al. |
| 7,505,308 B1 | 3/2009 | Assefa et al. |
| 7,989,223 B2 * | 8/2011 | Inomata et al. .................. 438/3 |
| 2004/0252539 A1 | 12/2004 | Parkin |
| 2006/0221677 A1 | 10/2006 | Klaeui et al. |
| 2006/0227466 A1 | 10/2006 | Yagami |
| 2006/0237808 A1 | 10/2006 | Saito |
| 2007/0195594 A1 | 8/2007 | Koga |
| 2007/0279973 A1 | 12/2007 | Oikawa |
| 2009/0141541 A1 | 6/2009 | Covington |

* cited by examiner

SPIN-TORQUE BASED MEMORY DEVICE WITH READ AND WRITE CURRENT PATHS MODULATED WITH A NON-LINEAR SHUNT RESISTOR

CROSS REFERENCE TO RELATED APPLICATIONS

This application is a divisional of application Ser. No. 12/701,867, filed Feb. 8, 2010, which is incorporated by reference herein.

BACKGROUND

The present invention relates to magnetic random access memory, and more specifically, to a spin-torque based memory device using a non-linear resistor to modulate read and write current paths.

A conventional spin-torque-based magnetic random access memory (MRAM) is based on a two-terminal, spin-torque-based magnetic memory element. This memory element uses the same terminals to sense the device resistance (at low voltage) and to switch the device state (at higher voltage). The sense, or "read" voltage operating point must be substantially smaller than the "write" voltage operating point to avoid read-induced device switching. For fast device switching, it is desirable to pass relatively large current through the device during the write operation, yet maintain the voltage across the device at a level substantially smaller than the breakdown voltage of the device. Such considerations lead to the desire for small device resistance to optimize the write operation. During the read operation, however, signal-to-noise considerations demand that the device resistance be substantially larger than the resistance of the series pass transistor. There is a conflicting requirement for low device resistance during the write operation and higher device resistance during the read operation. Because conventional magnetic tunnel junction (MTJ) spin-torque devices operate with similar read and write device resistance values, the overall circuit performance may be compromised, to provide adequate operating margins for reading and writing.

An alternative spin-torque-based MRAM element uses a three terminal geometry to completely separate the read and write circuit. Such devices, while allowing separate optimization of read and write parameters, are larger and more complex, adding to the cost of the circuit implementation.

It is therefore desirable to have a spin-torque based device that could combine the advantages of these two types of structures, while mitigate the shortcomings of them.

SUMMARY

According to one embodiment of the present invention, a fabrication method of forming a spin-torque based memory device is provided. The fabrication method includes forming a thin film stack on a substrate, the thin film stack including a spin polarizing layer, a spin transport layer formed on the spin polarizing layer, a free layer magnet formed on the spin transport layer, a non-magnetic layer formed on the spin polarizing layer, a reference layer formed on the non-magnetic layer, and a conductive hard mask layer formed on the reference layer. The method further includes lithographically patterning and etching the conductive hard mask layer and forming a read portion including the reference layer, the non-magnetic layer and the free layer magnet. The method further includes forming optional spacers along exposed surfaces of the etched conductive hard mask layer and the read portion and forming a nonlinear resistor layer on exposed surfaces of the spin-transport layer, the spacers, and the conductive hard mask layer. The method further includes forming a conductive cap layer over the nonlinear resistor, lithographically patterning and etching the conductive cap layer, the nonlinear resistor layer, the spin transport layer, and the spin polarizing layer and forming a write portion including the spin transport layer and the spin-polarizing layer, forming an interlevel dielectric layer over the conductive cap layer, and lithographically patterning and etching the interlevel dielectric layer to form a trench, exposing an upper conductive surface of the read and write portions.

According to another embodiment of the present invention, a fabrication method of forming a spin-torque based memory device includes forming a thin film stack on a substrate, the thin film stack including a spin-polarizing layer, a spin transport layer formed on the spin polarizing layer, a free layer magnet formed on the spin transport layer, a non-magnetic layer formed on the spin polarizing layer, a reference layer formed on the non-magnetic layer, and a conductive hard mask layer formed on the reference layer, lithographically patterning and etching the conductive hard mask layer and forming a read portion including the reference layer, the nonmagnetic layer and the free layer magnet, forming spacers along exposed surfaces of the etched conductive hard mask layer and the read portion, forming a nonlinear resistor layer on exposed surfaces of the spin transport layer, the spacers, and the conductive hard mask layer, lithographically patterning and etching the nonlinear resistor layer, the spin transport layer, and the spin polarizing layer and forming a write portion including the spin transport layer and the spin polarizing layer, forming an interlevel dielectric layer over the nonlinear resistor layer, and lithographically patterning and etching the interlevel dielectric layer to form a trench, exposing an upper surface of the reference layer of the read and write portions.

According to yet another embodiment of the present invention, a fabrication method of forming a spin-torque based memory device is provided. The fabrication method includes forming a thin film stack on a substrate, the thin film stack including a spin polarizing layer, a spin transport layer formed on the spin polarizing layer, a free layer magnet formed on the spin transport layer, a non-magnetic layer formed on the spin polarizing layer, a reference layer formed on the non-magnetic layer, and a hard mask layer formed on the reference layer. The method further includes lithographically patterning and etching the hard mask layer and forming a read portion including the reference layer, the non-magnetic layer and the free layer magnet. The method further includes forming optional spacers along exposed surfaces of the etched hard mask layer and the read portion and forming a nonlinear resistor layer on exposed surfaces of the spin-transport layer, the spacers, and the hard mask layer. The method further includes forming a conductive cap layer over the nonlinear resistor, lithographically patterning and etching the conductive cap layer, the nonlinear resistor layer, the spin transport layer, and the spin polarizing layer and forming a write portion including the spin transport layer and the spin-polarizing layer, forming an interlevel dielectric layer over the conductive cap layer, and lithographically patterning and etching the interlevel dielectric layer to form a trench, exposing an upper conductive surface of the read and write portions.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
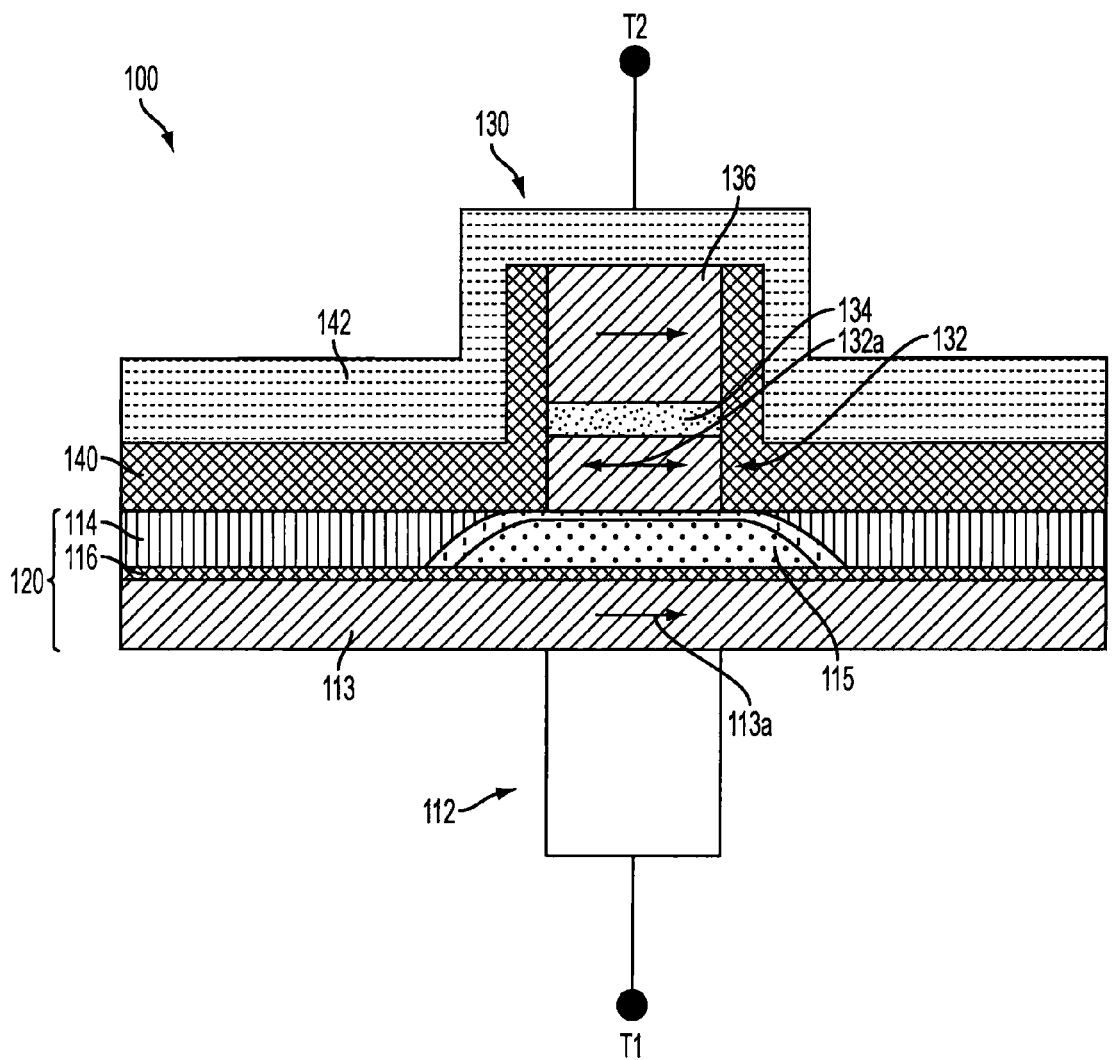
FIG. 1 is a diagram illustrating a spin-torque based memory device including a non-linear resistor that can be implemented within embodiments of the present invention.

With reference to FIG. 1, a spin-torque based memory device according to an embodiment of the present invention is provided. As shown in FIG. 1, a two-terminal spin-torque memory device 100 including two electrical connections, terminals T1 and T2, is provided. In the current embodiment, the memory device 100 includes a current concentrator pillar 112 (e.g., a write lead which is pillar-shaped).

The spin-torque based memory device 100 further includes a write portion 120. The write portion 120 includes a bottom fixed ferromagnetic (FM) reference layer 113 (i.e., a spin polarizing layer) which is in electrical contact with the current concentrator pillar 112. According to an embodiment of the present invention, the FM reference layer 113 has magnetization fixed in the direction indicated by the arrow 113a. As shown in FIG. 1, the arrow 113a points to the right; however, the present invention is not limited hereto. Alternatively, the magnetization (and arrow 113a) may be set to point in any direction suitable for operation in conjunction with the magnetization direction of layers 132 and 136 discussed below. The write portion 120 further includes a spin transport layer 114 having a spin accumulation region 115 formed above the bottom fixed FM reference layer 113 and centered around the current concentrator pillar 112. Lateral dimensions of spin accumulation region 115 are set by the spin diffusion length of the particular material used for spin transport layer 114, by spin depolarization at the interfaces of layer 114, and by the lateral dimension of the current concentrator pillar 112. Note that spin accumulation region 115 is shown only to highlight a region of spin transport layer 114; region 115 is formed from the same material as layer 114. The different shading of region 115 and layer 114 is only used to illustrate that region 115 has a substantially polarized electron spins during device operation, whereas other portions of layer 114 exhibit randomly polarized electron spins. The substantial polarization of electron spins in the spin accumulation region is created as electrical current passes through the polarizing reference layer 113 and the current concentrator pillar 112. The memory device 100 may further include a layer 116 (e.g., a spin-filtering spacer layer) that is a spin-preserving but resistive layer, such as a MgO tunnel barrier. This layer 116 has low-enough resistance * area product (RA) such that a sizable charge current (highly spin-polarized) can be injected into the spin transport layer 114 in FIG. 1 without breakdown of the layer 116. In a preferred embodiment, layer 116 may be omitted, in which case the FM reference layer 113 and the spin transport layer 114 form a direct spin-polarizing contact.

The spin-torque based memory device 100 further includes a read portion 130 (e.g., an MTJ element) that includes a free layer magnet 132 disposed on the spin transport layer 114, a read non-magnetic layer 134, and a reference layer 136. The read non-magnetic layer 134 can be a non-magnetic spin-preserving magnetic separation layer, such as a tunnel barrier. The reference layer 136 electrically contacts the T2 terminal. The direction of magnetization of the reference layer 136 is permanently fixed in the direction indicated by the arrow 136a. In the illustrated embodiment, the arrow 136a points to the right, however, in other embodiments the magnetization (and arrow 136a) may be set to point in any direction suitable for operation in conjunction with the magnetization direction of FM reference layer 113 and free layer magnet 132. The read portion 130 is disposed on the write portion 120 with a high quality interface formed during film growth to allow efficient interaction between the free layer magnet 132 and the spin current driven by the spin-accumulation region 115.

According to an embodiment of the present invention, the free layer magnet 132 is a nano-magnet having a magnetization direction indicated by the arrow 132a. The free layer magnet 132 serves as a memory element and the direction of the arrow 132a represents a particular memory state of the free layer magnet 132. For example, in a 2-level storage element, the magnetic moment of the free layer magnet 132 may be switched to be either parallel or antiparallel to the magnetization of reference layer 136 for maximum resistance difference between states as measured across read non-magnetic layer 134. Storage elements with more levels may require the magnetic moment of free layer magnet 132 to be stable in multiple discrete directions rather than just parallel and antiparallel to the magnetization of reference layer 136. The magnetic moment of the layers 113, 132 and 136 need not reside in the plane of the layers, and may exhibit a predetermined direction at least partially or even entirely out of the plane of the layers.

According to an embodiment of the present invention, the memory device 100 further includes a metal contact layer 142 overlying the read portion 130, and a nonlinear resistor 140 electrically in parallel with the read portion 130 and formed between an upper surface of the spin transport layer 114 and the metal contact region 142. Here, "nonlinear" refers to the characteristic resistance of the material as a function of applied voltage. At high applied voltage, the nonlinear resistor 140 exhibits relatively low resistance, whereas at low applied voltage, the nonlinear resistor 140 exhibits relatively high resistance. The nonlinear resistor 140 forms electrical contact between a portion of the spin transport layer 114 and a portion of the metal contact layer 142. The nonlinear resistor 140 modulates the write and read current paths depending on an applied voltage between terminals T1 and T2.

According to an embodiment of the present invention, the nonlinear resistor 140 may include titanium oxide or other nonlinear resistor materials. According to an embodiment of the present invention, the nonlinear resistor 140 may include variable-range hopping materials such as $TiO_{(2-x)}$, $Ti_xAl_yO_{(1-x-y)}$, $SrTiO_{(3-x)}$, $ZrO_{(1-x)}$, $SiO_x$, $HfO_x$, $FeO_x$, $Cs_2O$, $BaO$, semiconductor elements, phase change materials and any combinations thereof. According to an embodiment of the present invention, the nonlinear resistor 140 can be made of semiconductors with parallel-connected P/N and N/P structures. A pair of P/N and N/P diodes connected in parallel would have a well-defined turn-on voltage for both polarities (usually around 0.6V for silicon-based devices), and a very large resistance difference between on and off states. To realize such a structure, a P/N layer may be formed on one half of the device (e.g., to create the nonlinear resistor 140 on the left side of the read portion 130) and conversely an N/P layer may be formed on the other half of the device (e.g., on the right side of read portion 130). Polysilicon layers with equal areas of P/N and N/P doping or the combination of several materials may be used.

According to an embodiment of the present invention, a "read" operation is performed with low applied bias between terminals T1 and T2, and the resistance across the read nonmagnetic layer 134 is measured. At low bias, for example, 50 to 100 mV, the nonlinear resistor 140 is in a high resistance state (e.g., an "off" state). The read portion 130 dominates the current transport between the T1 and T2 terminals. Thus, a two-terminal resistive read operation may be performed to read out the status of the memory bit. That is, the current is transported between the first terminal T1 and the second terminal T2 through the read portion 130 to read a status of a relative orientation of the free layer magnet 132 against the reference layer 136 to determine a state of a memory bit. Different resistance values measured across read non-magnetic layer 134, corresponding to different orientations of the free layer's magnetization relative to the magnetization of top reference layer 136, determine the state of the memory bit. According to an embodiment of the present invention, a lesser amount of current than that of the read portion is transported through the nonlinear resistor 140 during the read operation.

According to an embodiment of the present invention, a "write" operation is performed with a high applied bias between terminals T1 and T2 to drive a substantial non-equilibrium spin accumulation in region 115. At high bias, for example, 1 V or higher, the nonlinear resistor 140 is in a decreased resistance state—less than the low-bias resistance by approximately 10 times or more. The majority of current between terminals T1 and T2 flows through nonlinear resistor 140 to the write portion rather than through read portion 130. The resistance of read portion 130, as measured across the read non-magnetic layer 134, is designed to be substantially higher than the low-resistance state (i.e. the on-state) resistance of the nonlinear resistor 140, and the current flow across element 134 thereby contributes minimally to the overall current.

The bottom current concentrator pillar 112, serves to concentrate the "write" current flow within the spin-accumulation region 115 formed immediately below the free layer magnet 132. The interface between the bottom fixed FM reference layer 113 and that of the spin transport layer 114 is spin polarizing, and forms a spin accumulation region 115 within the spin transport layer 114. Through suitable design of layer thicknesses and materials choices (e.g., relatively high lateral resistance of element 113), the "write" current flow may be substantially vertical between the pillar 112 and the spin transport layer 114 to efficiently form a strongly-polarized spin accumulation region 115 in the spin transport layer 114 directly above pillar 112 with minimal applied "write" current. The free layer magnet 132 is carefully aligned to pillar 112 so the largest concentration of polarized spins is directly below free layer magnet 132. The accumulated spins interact with the magnetic moment of the free layer magnet 132 to induce free layer magnetization 132a, switching the orientation of the free layer magnetization 132a in a direction parallel or anti-parallel to the fixed FM reference layer magnetization 113a, depending on a polarity of the current. The direction of the applied current determines the direction of polarization of the electron spins in the spin accumulation region 115. The material and thickness of spin transport layer 114 is chosen to maximize spin interaction with free layer magnet 132 while having sufficiently low resistance so as to allow efficient flow of electrical (non-spin-polarized) current from terminal T1 to terminal T2 in a path that includes nonlinear resistor 140 rather than read portion 130.

Alternatively, according to another embodiment of the present invention, when current is transported between the first terminal T1 and the second terminal T2, a comparable amount of current is transported through the nonlinear resistor 140 and through the read portion 130 simultaneously during the write operation.

Since electron "spin polarization" migrates according to diffusion processes, whereas electron "current flow" is affected by local electric fields, the two "spin" and "current" components can be spatially separated by using the structure described in the present embodiment. The "spin" component in the present embodiment "write" operation is created adjacent to the free magnetic layer for most efficient switching of the free layer. The "current" component in the present embodiment is directed to bypass the sensitive non-magnetic layer 134, permitting use of large currents (e.g., for fast write time or large window of operation) without damage to the non-magnetic layer 134. During the "read" operation, the nonlinear resistor 140 is biased so as to direct the "current" component across the non-magnetic layer 134, thereby permitting measurement of the device resistance across the non-magnetic layer 134. "Read" current can be kept small, yet with high signal-to-noise resistance readout, provided the non-magnetic layer 134 is designed with proper resistance. Small "read" currents will not generate enough spin accumulation to disturb the state of the magnetic free layer magnet 132. Unlike conventional 2-terminal devices, the present embodiment does not require both "read" and "write" currents to flow through non-magnetic layer 134. The present embodiment decouples the choice of resistance of non-magnetic layer 134 from the choice of operating current needed for the "read" operation versus the "write" operation.

According to the present embodiment, the nonlinear resistor layer 140 is designed for a 10:1 reduction of resistance between terminals T1 and T2 as one transitions from low to high bias between terminals T1 and T2. Alternatively, a nonlinear resistor 140 with a smaller on-off ratio, for example, 3:1, may be used to boost the spin-torque effect from the read portion's contribution to switching the free layer magnet 132, thereby improving the write efficiency (i.e., reducing the write threshold bias). Reduction in write threshold bias can improve device endurance by reducing the chance of device breakdown in the non-magnetic layer 134. For this purpose the magnetic directions of the two reference layers (the direction for fixed FM reference layer 113 and the direction for the reference layer 136) may need to be different, e.g. be opposite to each other.

Furthermore, if write efficiency is sufficient, the memory device 100 may be implemented with the element 132 experiencing a spin-torque direction from the spin accumulation side (the spin transport layer 114 and its spin-accumulation region 115) opposite to the spin-torque direction generated by spin-current from the reference layer 136. The magnetization directions of the fixed FM reference layer 113 and the reference layer 136 may be predetermined so as to enhance the spin-torque exerted on the free layer magnet 132, and thereby reduce a magnitude of a write current. According to another embodiment, the magnetization direction of layers 113 and 136 may be predetermined such that the spin-torque exerted on the free layer magnet 132 is suppressed to avoid a read disturbance. By balancing the spin-torque from the bottom and top elements, it is possible to achieve a zero or near-zero spin torque on the free layer magnet 132 for voltages appropriate for reading. This can be used to reduce the probability of a read-induced disturb to the bit state of the free layer magnet 132.

According to an embodiment of the present invention, these different torque directions could be controlled by controlling the magnetic polarization orientation of the two reference layers 113 and 136 in device 100. The bottom fixed FM reference layer 113 and the top read reference layer 136 may be designed as synthetic ferromagnets involving multilayers of anti-parallelly coupled FM layers pinned by an antiferromagnet, with a structure such as PtMn/CoFe/Ru/CoFe. By adjusting the relative layer thicknesses of such multilayers in the reference layers 113 and 136, one can independently chose the fixed magnetization direction of each of the two reference layers 113 and 136 by forcing a preferred state that is set during anneal above the antiferromagnet blocking temperature.

A multi-bit state structure according to another embodiment of the present invention may be constructed using a similar device arrangement. This structure may be utilized in fault tolerant multi-bit magnetic resistive memory networks, for example. A two-bit example is illustrated in FIG. 2 and is discussed below.

Figure 2:
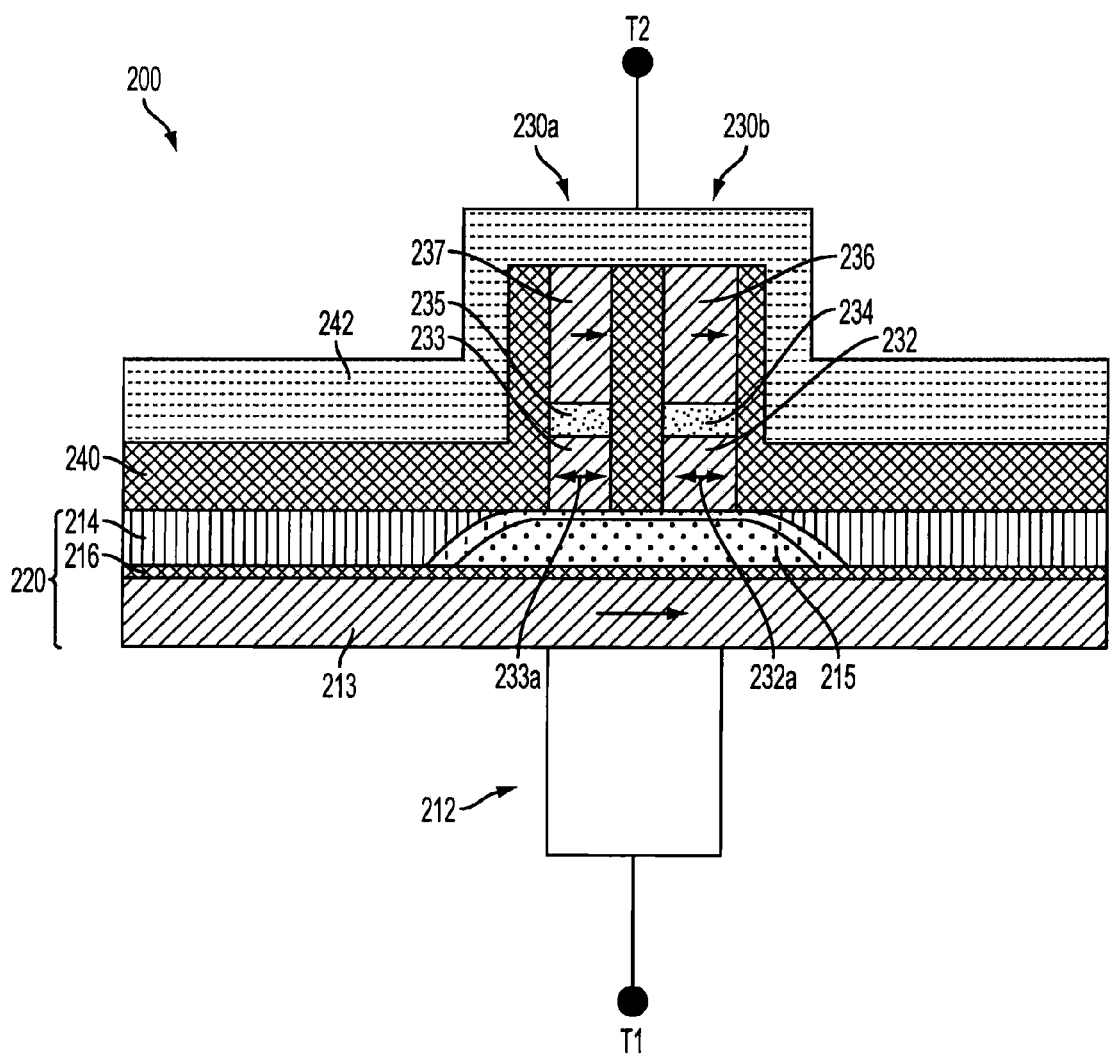
FIG. 2 is a diagram illustrating a spin-torque based multi-bit memory device including a non-linear resistor that can be implemented within alternative embodiments of the present invention, enabling multi-bit storage.

As shown in FIG. 2, a spin-torque memory device 200 is provided using non-linear resistor write-selection that can be implemented within alternative embodiments of the present invention. As shown in FIG. 2, the memory device 200 includes current concentrator pillar 212, a write portion 220 that includes a bottom fixed FM reference layer 213 (i.e., a spin polarizing layer) in electrical contact with the current concentrator pillar 212, a spin transport layer 214 formed on the FM layer 213 with optional interface layer 216, and exhibits a spin accumulation region 115 upon biasing. A first read portion and a second read portion adjacent to the first read portion and each in electrical contact with the spin transport layer 214 and a metal contact layer 242. The first and second read portions 230a and 230b each include a free layer magnet 232 and 233 having magnetic states as indicated by the arrows 233a and 232a respectively. The free layer magnets 232 and 233 are capped with non-magnetic layers 234 and 235 respectively and then with reference layers 236 and 237, respectively. The first and second read portions 230a and 230b may be surrounded by a nonlinear resistor 240. The metal contact layer 242 is formed over the nonlinear resistor 240 and the read portions 230a and 230b, contacting the terminal T2. The nonlinear resistor 240 is formed between the upper surface of the spin transport layer 214 and the metal contact layer 242. The nonlinear resistor 240 modulates write and read current paths depending on an applied voltage.

According to an embodiment of the present invention, the separate read portions 230a and 230b have different physical sizes and optionally are at different locations relative to the current concentrator pillar 212, so as to have different switching threshold currents/voltages. Read portions with smaller free layer volumes (e.g., element 233 rather than element 232 in FIG. 2) will exhibit state switching at lower applied "write" bias. Read portions located more closely to the current concentrator 212 (e.g., element 230a rather than element 230b in FIG. 2) will exhibit state switching at lower applied "write" bias. A combination of read portion size adjustment and read portion location adjustment can be used to set different threshold biases for state switching in the two read portions 230a and 230b. At low bias, the nonlinear resistor 240 is in a high resistance state and a read operation is performed via the first and second read portions 230a and 230b. At high bias, the nonlinear resistor 240 is in a low resistance state and a write operation is performed via the write portion 220. Current is transported between the first and second terminals T1 and T2 through the first and second read portions 230a and 230b to read a status of a relative orientation of each free layer magnet 232 and 233 against each reference layer 236 and 237 to determine a state of a plurality of memory bits. Alternatively, current is transported between the first and second terminals T1 and T2 through the nonlinear resistor 240 and is concentrated within the spin accumulation region 215 and accumulated spins interact with each free layer magnet 232 and 233 to induce free layer magnetization to become parallel or anti-parallel to a magnetization of the fixed ferromagnetic reference layer depending on a polarity and a magnitude of the current.

Upon application of a write current with increasing magnitude, first read portion 230a, then read portion 230b would switch its magnetic state. To write a device state with both read portions 230a and 230b having parallel magnetization, a large positive or a large negative write current is applied. To create differently-directed free layer magnetizations for the two read portions 230a and 230b, a large (positive or negative) write current is used to set read portion 230b along with read portion 230a. Then, a smaller write current below the threshold of read portion 230b (negative or positive) would be employed to switch read portion 230a alone. As long as the areas of the non-magnetic layers 235 and 234 are not identical, one obtains differing resistance values between terminals T1 and T2 for each of the four different possible magnetic states of the combined 2-element device 200.

In an embodiment of the present invention, the 2-bit example described in FIG. 2 can be generalized to higher numbers of bits with the implementation of higher numbers of read portions (i.e., more than two read portions), each individually sized and located to provide different switching thresholds and different resistance values.

FIGS. 3 through 8 illustrate a method for fabricating a spin-torque memory device of a magneto-resistive random access memory (MRAM) that can be implemented within embodiments of the present invention.

Figure 3:
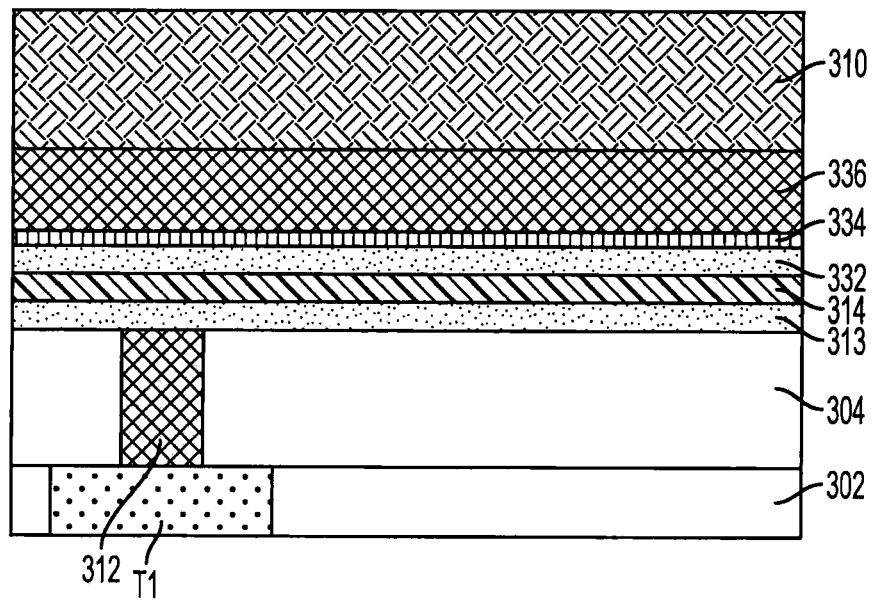
FIG. 3 is a diagram illustrating an initial fabrication operation of a method for fabricating a spin-torque based memory device that can be implemented within embodiments of the present invention.

FIG. 3 is a diagram illustrating an initial fabrication operation of a method for fabricating a spin-torque memory device that can be implemented within embodiments of the present invention. As shown in FIG. 3, a thin film stack is formed over a substrate (not shown). A conductive element T1 is disposed within an interlevel dielectric (ILD) layer 302 formed over the substrate and a conductive via 312 serving as a current concentrator is disposed in an interlevel dielectric layer 304 overlying the ILD layer 302. According to an embodiment of the present invention, the thin film stack includes a spin-polarizing layer 313, a spin transport layer 314 formed over the polarizer layer 313, a free layer magnet 332 and a nonmagnetic (e.g., tunnel barrier) layer 334 formed over the free layer magnet 332 are provided over the ILD layer 304. Reference layer (RL) 336 and a conductive hard mask layer 310 are formed over non-magnetic layer 334. An optional spin filtering spacer layer (such as layers 116 and 216 as depicted in FIGS. 1 and 2) may also be formed between the spin-polarizing layer 313 and the spin transport layer 314. The free layer magnet 332 may be formed of a layer of nickel-iron (NiFe), for example. The non-magnetic layer 334 may be formed of Mg oxide (MgO) or aluminum oxide ($Al_2O_3$), for example. Other materials available for use as non-magnetic layer 334 include oxides of magnesium, oxides of silicon, nitrides of silicon, and carbides of silicon; oxides, nitrides and carbides of other elements, or combinations of elements and other materials including or formed from semiconducting or normal-metal materials.

The hard mask layer 310 is formed from a conductive material such as tantalum nitride (TaN) or titanium nitride (TiN). Alternatively, the hard mask layer 310 may be formed from a dielectric material. If a dielectric material is utilized, further processing may be required to replace or shunt the material with a conductor after the hard mask has served its purpose during the read portion etching. Alternatively, multilayered hard mask material combinations may be used to optimize procedures used to etch the read portion, e.g., for endpoint signals or for etch stop layers to widen process margins.

Figure 4:
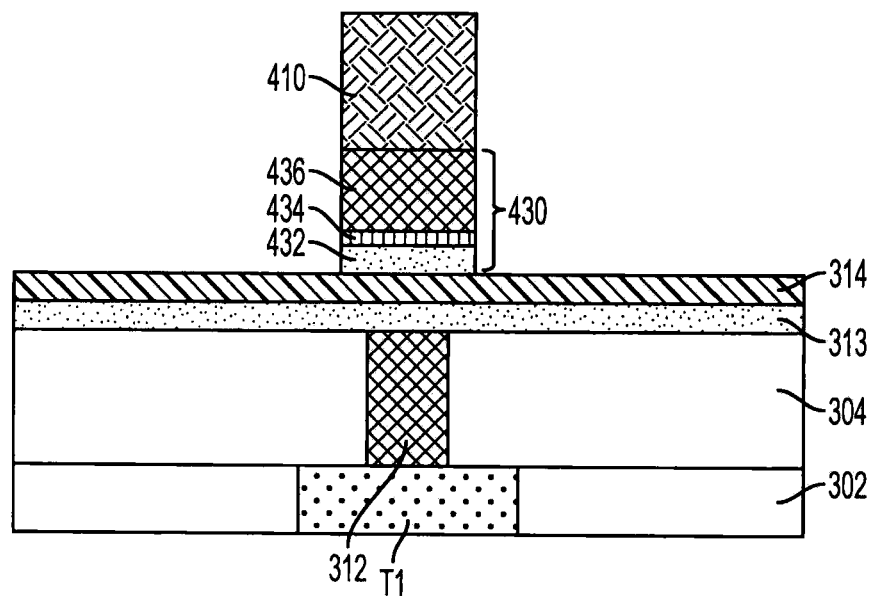
FIG. 4 is diagram illustrating an etching operation to define a read portion in a method for fabricating a spin-torque memory device that can be implemented within embodiments of the present invention.

FIG. 4 is diagram illustrating the structure after a read portion etching operation, in a method for fabricating a spin-torque memory device that can be implemented within embodiments of the present invention. The sequence of operations used to create the structure represented in FIG. 4 from the structure represented in FIG. 3 proceeds as follows. Firstly, a photolithographic mask is used to define the desired shape of the read portion, aligned as desired to the conductive pillar 312. Then the hard mask layer 310 is patterned with an etch technique such as reactive ion etching (RIE) to create a hard mask stud with shape 410 similar to the original photolithographic feature. The layers 336, 334, and 332 are formed by patterning with an etch technique such as RIE or ion beam etching (IBE) to shape the read portion 430 including the reference layer 436, the non-magnetic layer 434, and the free layer magnet 432, respectively. As shown in FIG. 4, this read portion etching procedure transfers the original photolithographic pattern through the free layer magnet 432 to expose an upper surface of the spin transport layer 314. The read portion 430 is analogous to the read portion 130 described in FIG. 1. Hard mask material and layer thickness 310 is chosen such that residual hard mask material 410 is optimized in thickness and shape for forming ensuing sidewall elements and contact to the upper conductive terminal (T2 from FIG. 1).

Figure 5:
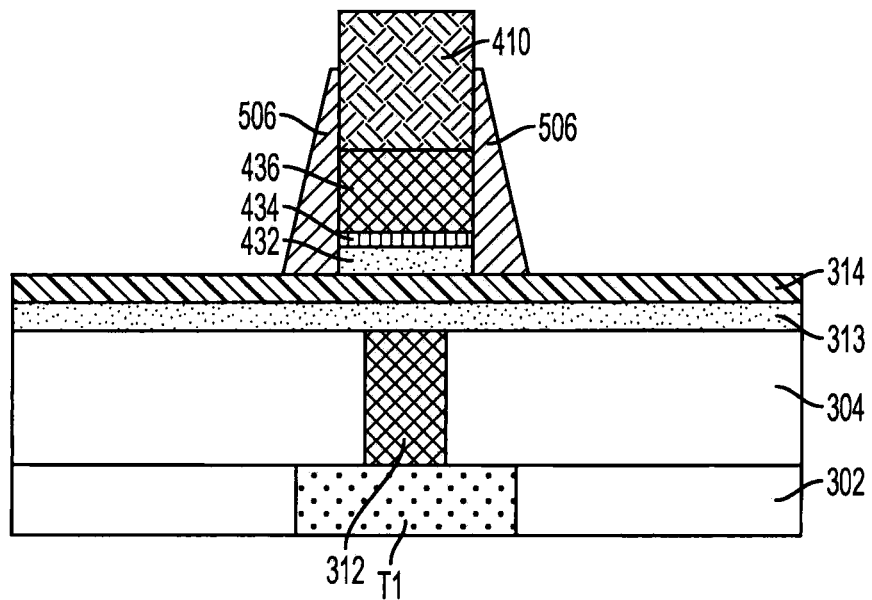
FIG. 5 is diagram illustrating deposition and etching operations of spacers in a method for fabricating a spin-torque based memory device that can be implemented within embodiments of the present invention.

FIG. 5 is diagram illustrating optional deposition and etching operations of sidewall spacers during a method for fabricating a spin-torque memory device that can be implemented within embodiments of the present invention. Sidewall spacers can be implemented as a means to adjust the current path through the nonlinear resistor, or to protect the sensitive read portion from further processing operations. An insulating material such as silicon nitride (SiN) is deposited on an upper surface of the spin transport layer 314 and encapsulating the read portion 430 and hard mask residue 410. Conformal deposition techniques such as atomic layer deposition are ideal for spacer material deposition. FIG. 5 shows the structure after the insulating material is etched from horizontal surfaces. The spin transport layer 314 acts as an etch stop layer, and the etch takes place in a directional fashion (e.g., with anisotropic RIE) to remove material from horizontal surfaces and leave behind material on sidewalls where shadowed by topography from previously-etched read portions. The anisotropic etch thereby forms insulating spacers 506 along exposed surfaces of the conductive hard mask layer 410 and the read portion 430, protecting the read portion 430 from further processing operations and preventing nonlinear resistor material (to be discussed below with reference to FIG. 6) from being deposited in contact with the read portion 430 sidewall. This can be used to effectively lengthen the current path through the nonlinear resistor material and ensure the nonlinear material current path resistance at low bias is substantially higher than that of the read portion 430. For example, if spacers 506 are not utilized, the current path through the nonlinear resistor may be dominated by a very short region adjacent to the non-magnetic layer 434, provided layers 432, 436, and 410 are very low resistance. The nonlinear resistor current path in this situation would be largely independent of nonlinear resistor thickness and cap material conductivity. Conversely, with the use of insulating spacers 506, the nonlinear resistor current path and its resistance will be tunable with nonlinear resistor material thickness, surface area, and use of conductive capping material.

Figure 6:
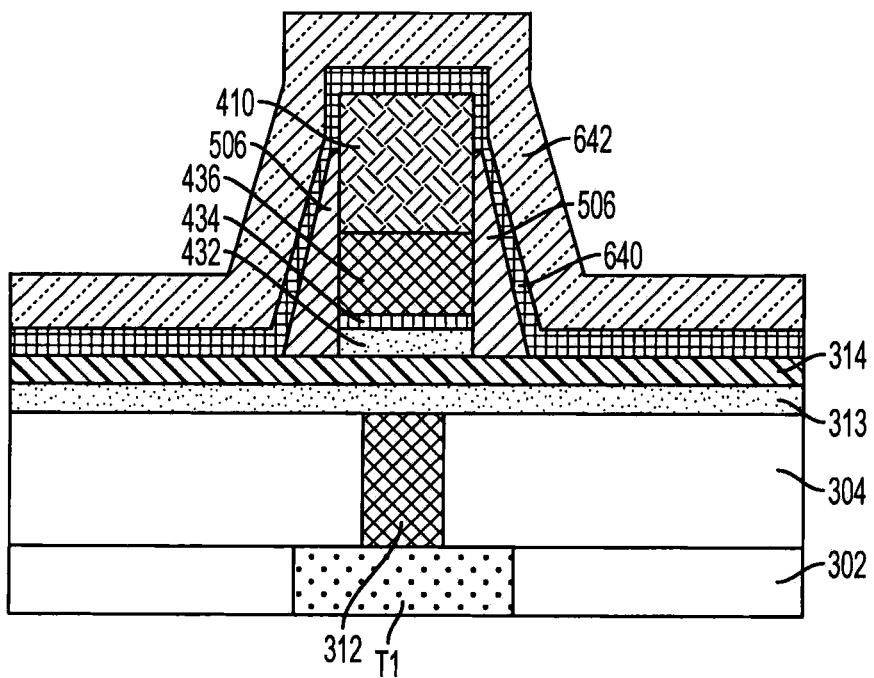
FIG. 6 is a diagram illustrating a deposition operation of a nonlinear resistor and conductive layer in a method for fabricating a spin-torque memory device that can be implemented within embodiments of the present invention.

FIG. 6 is a diagram illustrating a deposition operation of a nonlinear resistor and an optional conductive cap layer during a method for fabricating a spin-torque memory device that can be implemented within embodiments of the present invention. As shown in FIG. 6, a nonlinear resistor 640 is deposited along the upper surface of the spin transport layer 314, the spacers 506 and an upper surface of the conductive hard mask layer 410. According to an embodiment of the present invention, the nonlinear resistor 640 may be formed of variable-range hopping materials such as $TiO_{(2-x)}$, $Ti_xAl_yO_{(1-x-y)}$, $SrTiO_{(3-x)}$, $ZrO_{(i-x)}$, $SiO_x$, $HfO_x$, $FeO_x$, $Cs_2O$, BaO, semiconductor elements, phase change materials and any combinations thereof. The nonlinear resistor 640 may then be optionally capped by a conductive cap layer 642 if needed to tune the resistance of the current path through the nonlinear resistor. For example, if a conductive cap layer 642 is utilized as in FIG. 6, the current path through the nonlinear resistor will be dominated by vertical current flow between element 314 and element 642. Conversely, if conductive cap 642 is not employed, then the current path through the nonlinear resistor 640 will include a substantially longer path up the sidewall of the read portion to reach the top contact terminal. Longer current paths are beneficial if the nonlinear resistor material is of relatively low resistivity in the "off" state at low bias. A longer path makes the nonlinear resistive material shunt less of the "read" current from read portion 430 during "read" operations. If the choice of nonlinear resistor material is one of relatively high resistivity in the "on" state at high bias, then the design can benefit from any of the use of a conductive cap layer, a thinner nonlinear resistor layer, and even the elimination of sidewall spacers 506.

Figure 7:
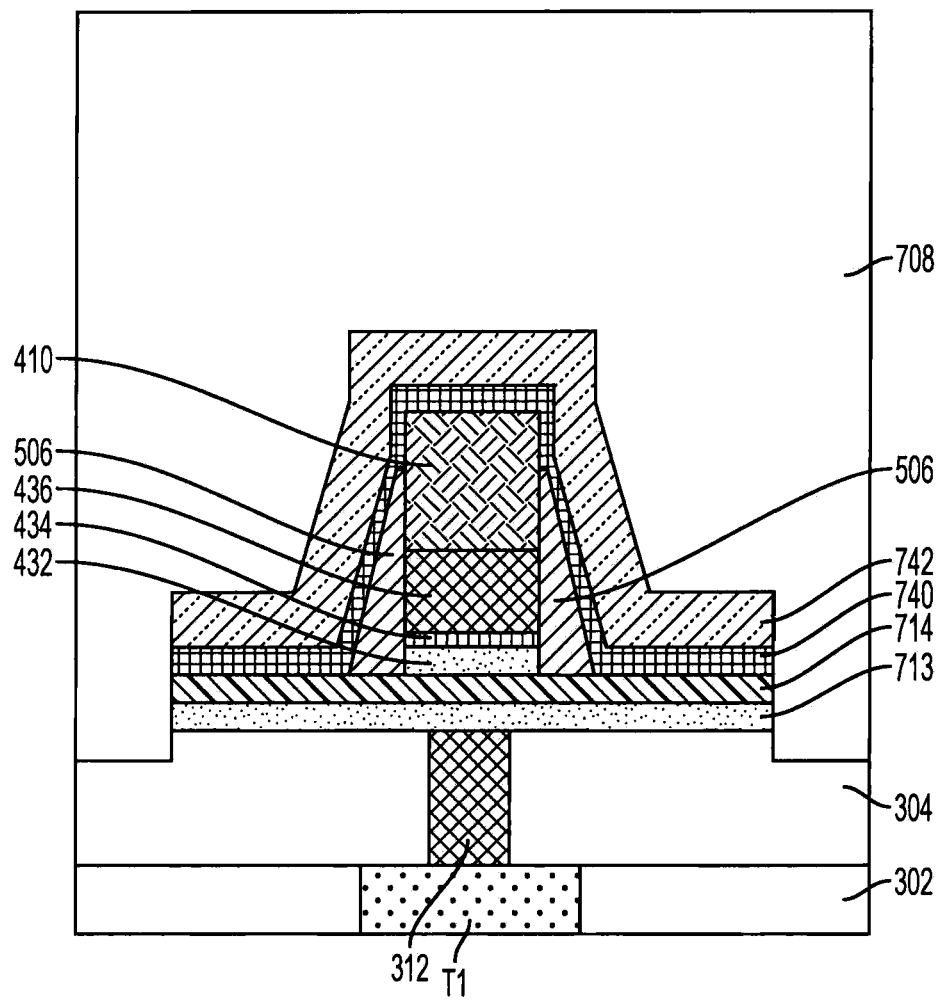
FIG. 7 is a diagram illustrating deposition and planarization of an interlevel dielectric layer in a method for fabricating a spin-torque based memory device that can be implemented within embodiments of the present invention.

FIG. 7 is a diagram illustrating isolation etching, top contact ILD deposition, and ILD planarization in a method for fabricating a spin-torque memory device that can be implemented within embodiments of the present invention. After the nonlinear resistor layer 640 and optional conductive cap layer 642 deposition described in FIG. 6, an etch technique is employed as desired to isolate write elements from neighboring devices. The etch can be masked in a self-aligned manner through the use of the conductive cap layer 642 in a spacer-etch technique like that described in FIG. 5, or the etch can be masked by additional mask material deposition and lithography steps. Lithographical patterning and etching of the conductive cap layer 642, the nonlinear resistor 640, the spin transport layer 314, the spin polarizing layer 313, and into the dielectric layer 304 is performed to form layers 742, 740, 714, and 713 as shown in FIG. 7. As a result, spin polarizing layer 713, spin transport layer 714, the nonlinear resistor 740, and optional conductive cap 742 are defined for each individual cell. After the etching process, an interlevel dielectric layer 708 is formed over the conductive cap layer 742 and is planarized, e.g., by chemical-mechanical polishing or planarizing flow of material 708 as it is deposited (as in a spin-on dielectric). The gaps between individual devices are thereby filled and planarized with interlevel dielectric material 708.

Figure 8:
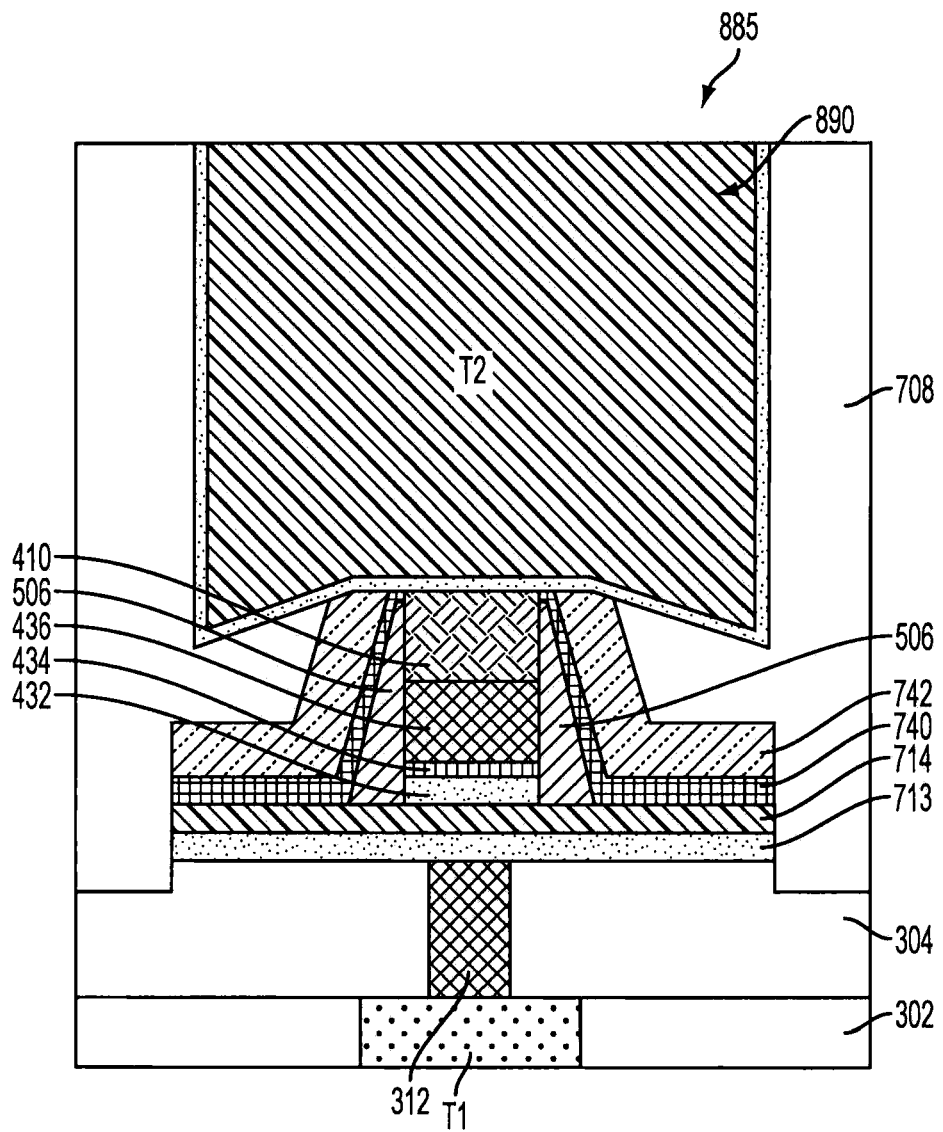
FIG. 8 is a diagram illustrating completion of the top contact to a spin-torque based memory device fabricated according to the fabrication method shown in FIGS. 3 through 7 that can be implemented within embodiments of the present invention.

FIG. 8 is a diagram illustrating a completed spin-torque memory device fabricated according to the fabrication method shown in FIGS. 3 through 7 that can be implemented within embodiments of the present invention. Following the planarized dielectric deposition 708 of FIG. 7, lithographical patterning and etching of the interlevel dielectric layer 708 is performed to form a trench 885 and exposing an upper surface of the conductive cap layer 742. The etch is masked with photolithography so as to create trenches only where wiring is desired. As shown in FIG. 8, the trench may be etched to a depth sufficient to expose a portion of nonlinear resistor 740 and conductive hard mask layer 410. The trench 885 is then filled with a conductive material 890, and is isolated from neighboring device trenches using, e.g., a conventional Damascene chemical mechanical polishing (CMP) process. The thus-formed conductive wiring in trench 885 makes contact to the top of the read portion 430 and write portion (elements 713 and 714) of the device 200, creating the T2 terminal analogous to that described in FIG. 1.

Embodiments of the present invention provide the advantages of fundamentally separating the read and write circuits within a two-terminal memory element while allowing separate optimization of the two circuits and improving overall circuit performance.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. For example, insulating spacers 506 or conductive cap element 742 can be omitted. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A fabrication method of forming a spin-torque based memory device, the method comprising:
    forming a thin film stack on a substrate, the thin film stack including a spin-polarizing layer, a spin transport layer formed on the spin polarizing layer, a free layer magnet formed on the spin transport layer, a non-magnetic layer formed on the spin polarizing layer, a reference layer formed on the non-magnetic layer, and a conductive hard mask layer formed on the reference layer;
    lithographically patterning and etching the conductive hard mask layer and forming a read portion including the reference layer, the nonmagnetic layer and the free layer magnet;
    forming spacers along exposed surfaces of the etched conductive hard mask layer and the read portion;
    forming a nonlinear resistor layer on exposed surfaces of the spin transport layer, the spacers, and the conductive hard mask layer;
    forming a conductive cap layer over the nonlinear resistor layer;
    lithographically patterning and etching the conductive cap layer, the nonlinear resistor layer, the spin transport layer, and the spin polarizing layer and forming a write portion including the spin transport layer and the spin polarizing layer;
    forming an interlevel dielectric layer over the conductive cap layer; and
    lithographically patterning and etching the interlevel dielectric layer to form a trench, exposing an upper surface of the conductive cap layer of the read and write portions.

2. The method of claim 1, wherein the read portion comprises a magnetic tunnel junction (MTJ).

3. The method of claim 1, wherein the nonlinear resistor is formed of a material including $TiO_{(2-x)}$, $Ti_xAl_yO_{(1-x-y)}$, $SrTiO_{(3-x)}$, $ZrO_{(1-x)}$, $SiO_x$, $HfO_x$, $FeO_x$, $Cs_2O$, and $BaO$, semiconductor elements, phase change materials or any combinations thereof.

4. The method of claim 1, further comprising:
    forming a spin filtering spacer layer between the spin transport layer and the spin polarizing layer.

5. The method of claim 1, further comprising:
    filling the trench with a conductive material layer to form a conductive line on the spin-torque based memory device.

6. The method of claim 1, wherein the free layer magnet includes a layer of nickel-iron material.

7. The method of claim 1, wherein the conductive hard mask layer includes a nitride material.

8. A fabrication method of forming a spin-torque based memory device, the method comprising:
  forming a thin film stack on a substrate, the thin film stack including a spin-polarizing layer, a spin transport layer formed on the spin polarizing layer, a free layer magnet formed on the spin transport layer, a non-magnetic layer formed on the spin polarizing layer, a reference layer formed on the non-magnetic layer, and a conductive hard mask layer formed on the reference layer;
  lithographically patterning and etching the conductive hard mask layer and forming a read portion including the reference layer, the nonmagnetic layer and the free layer magnet;
  forming spacers along exposed surfaces of the etched conductive hard mask layer and the read portion;
  forming a nonlinear resistor layer on exposed surfaces of the spin transport layer, the spacers, and the conductive hard mask layer;
  lithographically patterning and etching the nonlinear resistor layer, the spin transport layer, and the spin polarizing layer and forming a write portion including the spin transport layer and the spin polarizing layer;
  forming an interlevel dielectric layer over the nonlinear resistor layer; and
  lithographically patterning and etching the interlevel dielectric layer to form a trench, exposing an upper surface of the reference layer of the read and write portions.

9. The method of claim 8, wherein the read portion comprises a magnetic tunnel junction (MTJ).

10. The method of claim 8, wherein the nonlinear resistor is formed of a material including $TiO_{(2-x)}$, $Ti_xAl_yO_{(1-x-y)}$, $SrTiO_{(3-x)}$, $ZrO_{(1-x)}$, $SiO_x$, $HfO_x$, $FeO_x$, $Cs_2O$, and $BaO$, semiconductor elements, phase change materials or any combinations thereof.

11. The method of claim 8, further comprising:
  forming a spin filtering spacer layer between the spin transport layer and the spin polarizing layer.

12. The method of claim 8, further comprising:
  filling the trench with a conductive material layer to form a conductive line on the spin-torque based memory device.

13. The method of claim 8, wherein the free layer magnet includes a layer of nickel-iron material.

14. The method of claim 8, wherein the conductive hard mask layer includes a nitride material.

15. A fabrication method of forming a spin-torque based memory device, the method comprising:
  forming a thin film stack on a substrate, the thin film stack including a spin-polarizing layer, a spin transport layer formed on the spin polarizing layer, a free layer magnet formed on the spin transport layer, a non-magnetic layer formed on the spin polarizing layer, a reference layer formed on the non-magnetic layer, and a hard mask layer formed on the reference layer;
  lithographically patterning and etching the hard mask layer and forming a read portion including the reference layer, the nonmagnetic layer and the free layer magnet;
  forming spacers along exposed surfaces of the etched hard mask layer and the read portion;
  forming a nonlinear resistor layer on exposed surfaces of the spin transport layer, the spacers, and the hard mask layer;
  lithographically patterning and etching the nonlinear resistor layer, the spin transport layer, and the spin polarizing layer and forming a write portion including the spin transport layer and the spin polarizing layer;
  forming an interlevel dielectric layer over the nonlinear resistor layer; and
  lithographically patterning and etching the interlevel dielectric layer to form a trench, exposing an upper surface of the reference layer of the read and write portions.

16. The method of claim 15, wherein the read portion comprises a magnetic tunnel junction (MTJ).

17. The method of claim 15, wherein the nonlinear resistor is formed of a material including $TiO_{(2-x)}$, $Ti_xAl_yO_{(1-x-y)}$, $SrTiO_{(3-x)}$, $ZrO_{(1-x)}$, $SiO_x$, $HfO_x$, $FeO_x$, $Cs_2O$, and $BaO$, semiconductor elements, phase change materials or any combinations thereof.

18. The method of claim 15, further comprising:
  forming a spin filtering spacer layer between the spin transport layer and the spin polarizing layer.

19. The method of claim 15, further comprising:
  filling the trench with a conductive material layer to form a conductive line on the spin-torque based memory device.

20. The method of claim 15, wherein the hard mask layer includes a dielectric material.

* * * * *